United States Patent [19]

Fox et al.

[11] Patent Number: 5,239,441
[45] Date of Patent: Aug. 24, 1993

[54] UNDERGROUND POWER LINE FAULT LOCATING SYSTEM

[75] Inventors: Larry D. Fox, Newberg; Robert K. Flath, Hillsboro, both of Oreg.

[73] Assignee: Portland General Electric Corporation, Portland, Oreg.

[21] Appl. No.: 571,174

[22] Filed: Aug. 20, 1990

[51] Int. Cl.$^5$ .............................................. H02H 5/04
[52] U.S. Cl. ..................................... 361/104; 361/58; 324/531
[58] Field of Search ..................... 361/58, 104, 42, 115, 361/62, 67, 430, 363, 349, 347, 335; 324/72.5, 133, 149, 512, 522, 531

[56] References Cited

U.S. PATENT DOCUMENTS

| | | | |
|---|---|---|---|
| 3,450,948 | 6/1969 | Gerlach et al. | 317/26 |
| 3,544,985 | 12/1970 | Lawrence | 340/248 |
| 3,641,545 | 2/1972 | Okada | 340/248 B |
| 4,104,581 | 8/1978 | Arkosy | 324/523 |
| 4,152,643 | 5/1979 | Schweitzer, Jr. | 324/120 |
| 4,161,762 | 7/1979 | Scheithauer | 361/124 |
| 4,263,550 | 4/1981 | Schweitzer, Jr. | 324/133 |
| 4,333,121 | 6/1982 | Schwarz | 361/104 |
| 4,335,415 | 6/1982 | Hooberry | 361/124 X |
| 4,506,310 | 3/1985 | Schwarz | 361/104 |
| 4,686,600 | 8/1987 | Morris et al. | 361/42 |
| 4,689,708 | 8/1987 | Hager et al. | 361/65 |

FOREIGN PATENT DOCUMENTS 467429  7/1975  U.S.S.R. .

*Primary Examiner*—Steven L. Stephan
*Assistant Examiner*—Ed To
*Attorney, Agent, or Firm*—Klarquist, Sparkman, Campbell, Leigh & Whinston

[57] ABSTRACT

A fault locating system for locating a fault in an underground power distribution system includes a method and an apparatus. The underground power distribution system receives and distributes power from a bulk power source to power consumers through a fused switchgear unit and a first vault. The first vault distributes power from the fused switchgear unit among plural outgoing underground power lines, with each line supplying power to at least one power consumer. A current limiting apparatus for locating faults in the above system includes an enclosure of an insulative material defining a fuse receiving chamber. First and second bushings extend through the enclosure to the fuse receiving chamber. The apparatus has a current limiting fuse received by the respective first and second bushings within the fuse receiving chamber. The method includes the steps of identifying the fused switchgear unit and the first vault which normally supply power to a line having the fault, and installing a fault indicator on each underground outgoing power line in the first vault. The current limiting fuse of the apparatus is inserted in series with and between the fused switchgear unit and the first vault. The first vault is reenergized through the current limiting fuse, which causes the current limiting fuse to blow. After the reenergizing step, each fault indicator is read to determine the location of the fault.

9 Claims, 3 Drawing Sheets

UNDERGROUND POWER LINE FAULT LOCATING SYSTEM

BACKGROUND OF THE INVENTION

The present invention relates generally to a fault locating system for locating a fault in a power distribution system, and more particularly to an improved method and apparatus for locating a fault in an underground power distribution system, such as may be used in residential or urban settings.

Other fault locating systems have been used to locate faults in overhead power distribution systems. Overhead power distribution systems are typically used in rural settings, and, less frequently today than in the past, in residential and urban settings. Overhead distribution systems typically have fused cutout switches mounted on power distribution poles at various locations along a given distribution line. Often the cutout switches incorporate a current limiting fuse. When a fault occurs in the overhead distribution system, the fused cutout switch in series with the fault typically blows open. The line crew may visually inspect the faulted line from a repair vehicle, and locate the faulted portion of the line when the open cutout switch is seen. The faulted portion of the line is then isolated from the balance of the power system for repair.

Underground power distribution systems are not as easily inspected as overhead distribution systems because the majority of the components are located beneath ground level. Some of the underground power distribution system components are located above ground, such as fused switchgear, but the above-ground components are supplied as a totally enclosed pad mounted unit. Furthermore, the extensive use of underground power distribution systems is a more recent development, that is, for many years the vast majority of power distribution systems have been overhead systems.

An earlier known method to locate a fault in an underground distribution power system uses a trial and error trouble shooting process. Using this known method (described in further detail below) the upstream power consumers or customers, that is the customers between the fault and the substation, continually experience intermittent power outages followed by voltage spikes upon re-energization of the line. This earlier method is a particular inconvenience and disruption for upstream customers running computers and other high technology devices on line power. Thus, the upstream customers are hampered and may suffer damage as a result of any lack of reliability of the utility's power distribution system.

Known methods of trouble shooting underground distribution systems to locate a fault impose significant safety hazards on line crew personnel. In an underground vault, the suspect power lines, that is those lines suspected of having the fault, are each disconnected and the blown switchgear fuses are replaced. The suspect power lines are manually reenergized one at a time using a hot stick. Upon reenergizing the faulted line, arcing flashovers and ensuing vault fires may occur. The danger of flashover, and resulting injury to one's eyes if viewed, leads to the practice of the line crew member facing away from the vault and pushing backward on the hot stick to reconnect each suspect line. If a vault fire should occur, it does so behind the line crew member's back, which may delay a reaction to move to safety. Beyond the danger to line crew personnel, a vault fire can significantly damage the connecters, cables, and any other equipment in and around the vault.

Thus, a need exists for an improved underground power line fault locating method and apparatus, such as may be used in residential settings, which is not susceptible to the above limitations and disadvantages.

SUMMARY OF THE INVENTION

It is an overall object of the present invention to provide an improved underground power distribution system fault locating system, method and apparatus.

A further object of the present invention is to provide an improved underground power distribution system fault locating system which eliminates unnecessary power outages and voltage spikes to power consumers or customers upstream of the fault.

An additional object of the present invention is to provide an improved underground power distribution system fault locating system which fosters better customer creditability in the utility's distribution system.

A further object of the present invention is to provide an improved underground power distribution system fault locating system which is safer for line crews to trouble shoot to locate a fault.

Another object of the present invention is to provide an improved underground power distribution system fault locating system which minimizes the chance of vault fires, and subsequent damage to vault equipment.

Still another object of the present invention is to provide an improved underground power distribution system fault locating apparatus that is lightweight, portable, and easy to operate.

Yet another object of the present invention is to provide an improved method of locating a fault in an underground power distribution system which may be safely and easily used.

According to one aspect of the present invention, a method of locating a fault in an underground power distribution system is provided. A typical underground power distribution system receives power from a bulk power source and distributes the received power to power consumers through a fused switchgear unit and a first vault. The first vault distributes power from the fused switchgear unit among plural outgoing underground power lines. Each underground outgoing power line typically supplies power to at least one power consumer. The method includes the steps of identifying the fused switchgear unit and the first vault which normally supply power to a line having the fault, and installing a fault indicator on each underground outgoing power line in the first fault. In an inserting step, a current limiting fuse is inserted in series with and between the fused switchgear unit and the first vault. In a reenergizing step, the first vault plural outgoing power lines are reenergized through the current limiting fuse which causes the current limiting fuse to blow or open upon receiving the fault current. In a reading step, each fault indicator is read after the reenergizing step to determine the location of the fault.

In an illustrated embodiment, the method also includes the steps of checking the fusing within the fused switchgear unit to determine in which phase the fault has occurred. In a checking step, the continuity of a power line interconnecting the fused switchgear with the first vault is checked. For a power system having at least one subsequent vault receiving power from the first vault, the installing method described above also includes the step of installing a fault indicator on each of the underground outgoing power lines of each subsequent vault, as well as in the first vault. For a power utility system having at least one underground outgoing power line delivering power to at least one distribution transformer, the step of installing the fault indicators further includes installing a fault indicator on each distribution transformer. Preferably, the current limiting fuse blows or opens before a substation recloser can operate so as to prevent upstream power consumers from experiencing an interruption in power delivery due to operation of the substation recloser.

According to another aspect of the present invention, a current limiting apparatus is provided for locating faults in an underground power distribution system as described above. The apparatus includes an enclosure of an insulative material defining a fuse receiving chamber. First and second bushings extend through the enclosure to the fuse receiving chamber. The apparatus also has a current limiting fuse having first and second terminals with a fuse element interconnecting the first and second terminals. The first and second terminals are received by the respective first and second bushings within the fuse receiving chamber.

In an illustrated embodiment, the enclosure is a box-like shape having a lid with first and second holes therethrough to receive the respective first and second bushings. The apparatus also includes a grounding contact on an exterior surface of the enclosure. The apparatus also has bushing grounding means for interconnecting the first and second bushings with the grounding contact. Preferably, the first and second bushings each have a spring biased fuse receiving clip for rapidly installing and removing the current limiting fuse.

The present invention relates to the above features and objects individually as well as collectively. These and other objects, features and advantages of the present invention will become apparent to those skilled in the art from the following description and drawings.

DETAILED DESCRIPTION OF A PREFERRED EMBODIMENT

Figure 1:
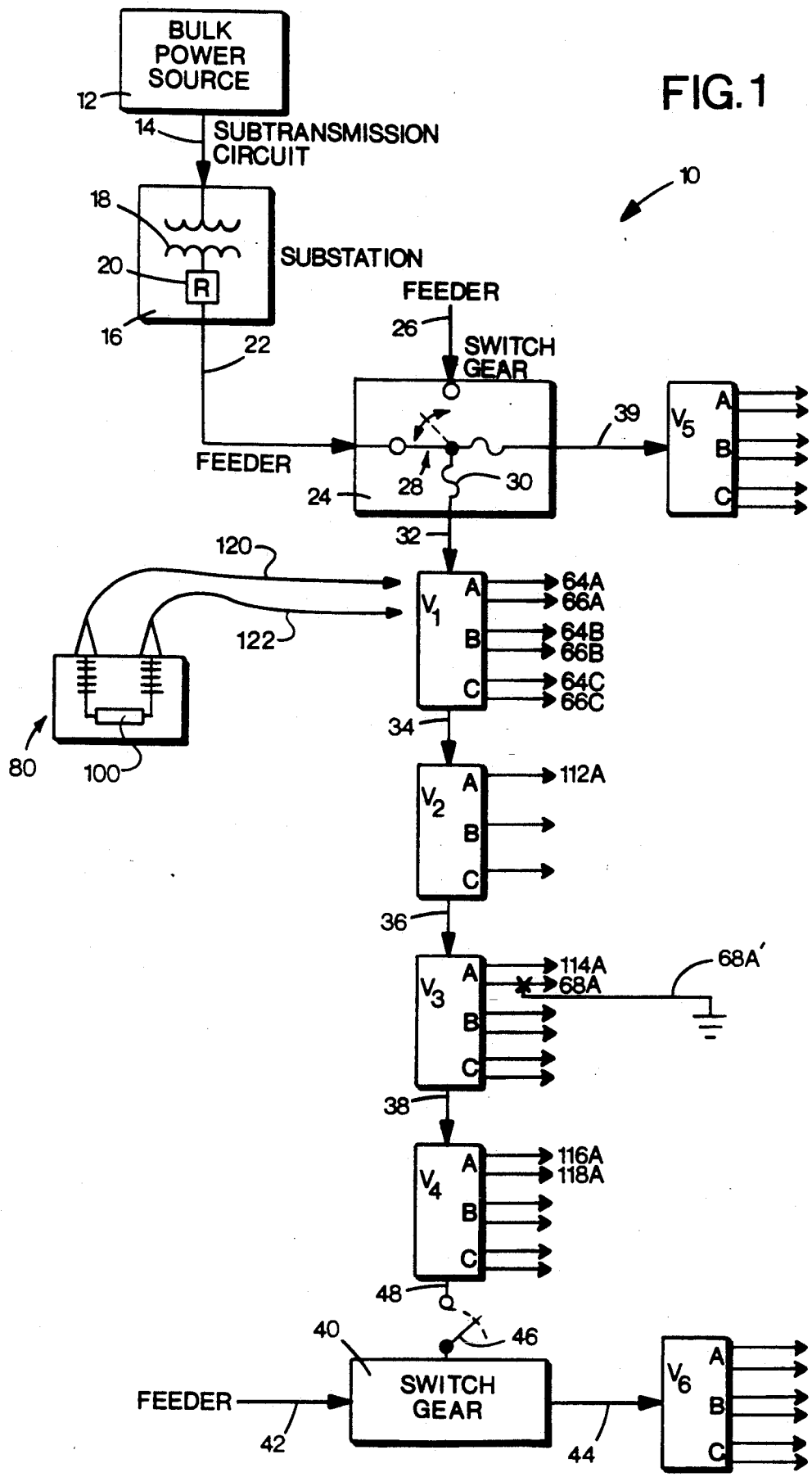
FIG. 1 is a schematic block diagram of a typical electric utility system illustrating one form of a portion of an underground power distribution system fault locating apparatus of the present invention.

FIG. 1 illustrates a typical electric utility system 10 which will be used to illustrate the method of the present invention. Bulk electrical power is generated by a bulk power source 12, such as a hydro or coal fired power plant. A plurality of subtransmission circuits, such as high volt line 14, deliver the bulk electrical power to a network of distribution substations, such as substation 16. Typically, the high volt line 14 carries polyphase power, such as three phase power, with each phase designated herein as either A, B or C. The substation 16 includes a step-down power transformer 18 and an auto reclosing circuit breaker with reclosing relays, such as a recloser 20.

Primary circuit feeders, such as feeder 22, deliver power from the substation 16 to fused switchgear units, such as a pad mounted switchgear 24. The switchgear 24 may also receive power from another substation (not shown) via a second feeder 26. The switchgear 24 has internal switching for each phase, represented in single line diagram fashion as switch 28, to receive power from either of the feeders 22 or 26.

The switchgear 24 has a fuse bank 30 in series with switch 28 and comprising three fuses 30A, 30B and 30C (not shown in the single line diagram) in each of the phases A, B and C. The switchgear 24 supplies power through fuse bank 30 and power line 32 to a first vault $V_1$. Vaults $V_1$, $V_2$, $V_3$ and $V_4$ are interconnected by respective underground power lines 34, 36 and 38. The switchgear 24 may also supply power to a second series of vaults beginning with power line 39 delivering power to a vault $V_5$. Subsequent vaults (not shown) may be connected to vault $V_5$ in the manner illustrated for interconnecting vaults $V_1$, $V_2$, $V_3$, and $V_4$.

The electric utility system 10 includes a second switchgear 40 which receives power from an additional distribution substation (not shown) via a third feeder 42. Normally, switchgear 40 delivers power to vault $V_6$ via power line 44. The vault $V_6$ may be connected to subsequent vaults (not shown) in the same manner that vaults $V_1$, $V_2$, $V_3$ and $V_4$ are interconnected. Under emergency conditions, such as the failure of substation 16 or switchgear 24, a switch 46 may be closed to complete a normally open tie line 48 from vault $V_4$ to switchgear 40. With switch 46 closed, vaults $V_1$ through $V_4$ receive power from the adjacent feeder 42 through switchgear 40.

In the typical electric utility system 10, the substation recloser 20 instantaneously clears and reconnects the outgoing primary circuit feeders, such as feeder 22, in series with a fault. The recloser 20 is designed to prevent fuses in the power distribution system, such as the fuses in fuse bank 30, from blowing due to temporary faults, such as birds or tree limbs momentarily faulting overhead distribution lines. The operation of the recloser 20 occurs faster than the melting capability of the fuses in the power distribution system. Thus, long term outages and fuse replacements are not required by the occurrence of a temporary short circuit.

The minimum pick-up current required to operate the recloser 20 is usually equal to twice the continuous rating of the recloser. When a temporary fault occurs on the system, the recloser may be set to operate once, twice three or four times instantaneously, to limit the fault current in the line while the temporary fault is cleared. For permanent faults, the fusing and recloser 20 may be coordinated so the first fuse link on the line experiencing the fault blows during the next to last operation of the recloser. When so coordinated, the blown fuse isolates the line before the recloser 20 locks open after the last operation. In this manner, the fault is isolated by operation of the fuse, and the recloser 20 resets automatically to restore service everywhere except beyond the blown fuse.

Figure 2:
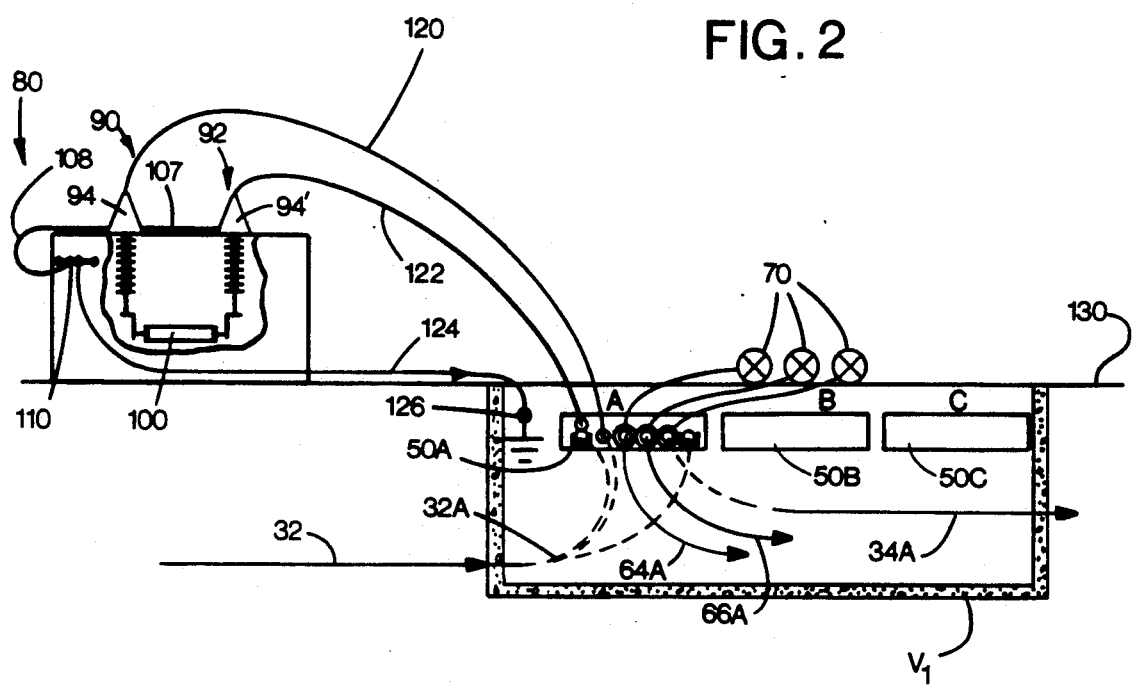
FIG. 2 is a partially schematic vertical sectional view of one form of a current limiting apparatus of the present invention for locating a fault in an underground power distribution system, the apparatus shown in use in an underground vault to illustrate a method of the present invention of locating a fault in the underground power distribution system.
Figure 3A:
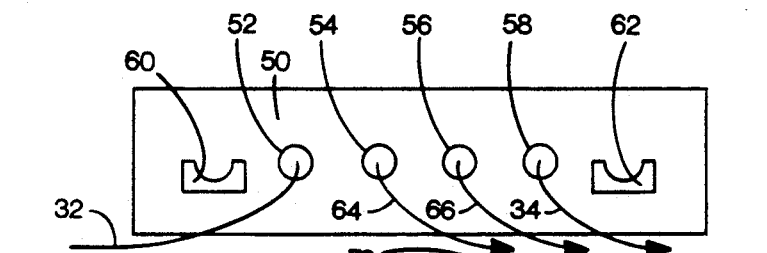
FIG. 3 comprises FIGS. 3A, 3B and 3C which are partially schematic detailed views of a portion of the underground vault shown in FIG. 2.

The vault $V_1$ is illustrated schematically in FIG. 2 as having four way connection terminals or laterals for each phase, such as laterals 50A, 50B and 50C for connections of respective phases A, B and C. For clarity, the connections to phases B and C have been omitted, but it is apparent that laterals 50B and 50C may be identical to lateral 50A. FIG. 3A illustrates a normal connection for a vault lateral 50 having four terminals 52, 54, 56 and 58 positioned between two open parking terminals 60 and 62. Terminals 52, 54, 56 and 58 are electrically interconnected to one another. A single phase from line 32 is connected to terminal 52, and lines 64 and 66 are connected to respective terminals 54 and 56. Lines 64 and 66 deliver power to power consumers or customers via step down distribution transformers (not shown). Line 34 is connected to terminal 58 to deliver power from vault $V_1$ to vault $_2$. The remaining vaults $V_2$, $V_3$, $V_4$, $V_5$ and $V_6$ may be set up in the same manner as vault $V_1$.

With the electric utility system 10 and vaults now understood, an earlier known method of locating a fault will be described. For example, suppose on line 68A, which issues from the phase A lateral of vault $V_3$, a permanent fault 68A' occurs. The fault 68A' is illustrated as a line to ground fault. To locate the fault, a plurality of fault indicators 70 are used. One suitable fault indicator is a self reset linear fault indicator made by McGraw-Edison Company, Power Systems Division, Pittsburgh, Pa. 15230. The illustrated fault indicator 70 has a clamp-on current transducer which surrounds a power line, such as line 64A connected to terminal 54 of lateral 50 (see FIGS. 2 and 3A). When a fault current flows through line 64A, the fault indicator 70 displays the letter "F" for fault, and if no fault current is detected the letter "N" is displayed for neutral.

In this earlier known method, plural fault indicators 70 are installed at various locations along a suspected faulted line, and the line is reenergized. All of the fault indicators from the power source to the fault indicate "F", while those indicators beyond the fault will indicate "N" since no current is delivered beyond the fault. The exact location of the fault is determined upon reading the fault indicators after re-energizing the faulted line. In some instances, the fault indicators may be permanently installed in the electric utility system 10 instead of installing the indicators as needed during trouble shooting.

When a permanent fault, such as fault 68A' occurs, fuse 30A in the switchgear 24 blows after failure of the fault to clear during operation of the substation recloser 20. In this earlier known method, the line crew inspects the fuses in the switchgear fuse bank 30 and determines that the phase A fuse 30A is blown.

In this earlier known method, the line crew proceeds to the first vault $V_1$, and disconnects the incoming the phase A portion of line 32, that is line 32A, from lateral 50A. The disconnected line 32A is placed on an insulated standoff bushing 72 positioned, for example, in parking terminal 62 (see FIG. 3B). The disconnected line 32 is checked for faults from vault $V_1$ back to the switchgear 24. If no faults are found on line 32, fault indicators 70 are installed on all phase A lines issuing from vaults $V_1$, $V_2$, $V_3$ and $V_4$.

In this earlier known method, a two position or two-way connector 74 having two electrically interconnected terminals 76 and 78, is positioned in parking terminal 60. Two of the outgoing lines from vault $V_1$, such as lines 64 and 66, are connected to terminals 76 and 78 of the two-way connector 74. Incoming line 32 is reconnected to terminal 52, and line 34 is connected to the insulated terminal 72. With no outgoing lines on the lateral, line 32 is re-energized from the fuse position 30A in switchgear 24. Using a hot stick, the line crew then reconnects, one at a time, lines 64, 66 and 34 to their respective terminals 54, 56 and 58.

Using this known method, one of the lines 64, 66 or 34 is the faulted line which draws the full fault current when reconnected. The lines are reconnected one by one using a hot stick, with the line crew worker standing on ground level. During reconnection of the faulted line, the fault current often causes arcing and vault fires. To prevent injury to the eyes of the line crew, the reconnection of the line is started while facing the vault. The line terminals typically have an arc-snuffing guide tip for aligning the line and lateral terminal. The line crew worker then turns to face away from the vault and pushes in a rearward direction on the hot stick to complete the connection. Upon reconnection of the faulted line, the substation recloser 20 attempts to clear the fault, and the fault current continues until fuse 30A blows, opening the line. However, if a vault fire has started, before the fuse opens, the repeated operation of recloser 20 continues to feed fault current to the vault. The vault fire increases in size with each attempt of recloser 20 to reinstate the line.

Using this known method, the repeated operation of the substation recloser 20 affects all other upstream customers receiving power from the substation via switchgear 24, such as those upstream customers receiving power from vault $V_5$. These upstream customers experience both power outages from the opening of recloser 20 and voltage spikes from the reconnecting attempts of the recloser 20. Such voltage spikes and blackouts can be particularly disruptive and potentially destructive for high tech users, such as those in the computer industry and those having computer controlled manufacturing equipment. This leads to bad customer relations for the electric utility company, and degrades customer confidence in the utility.

Figure 4:
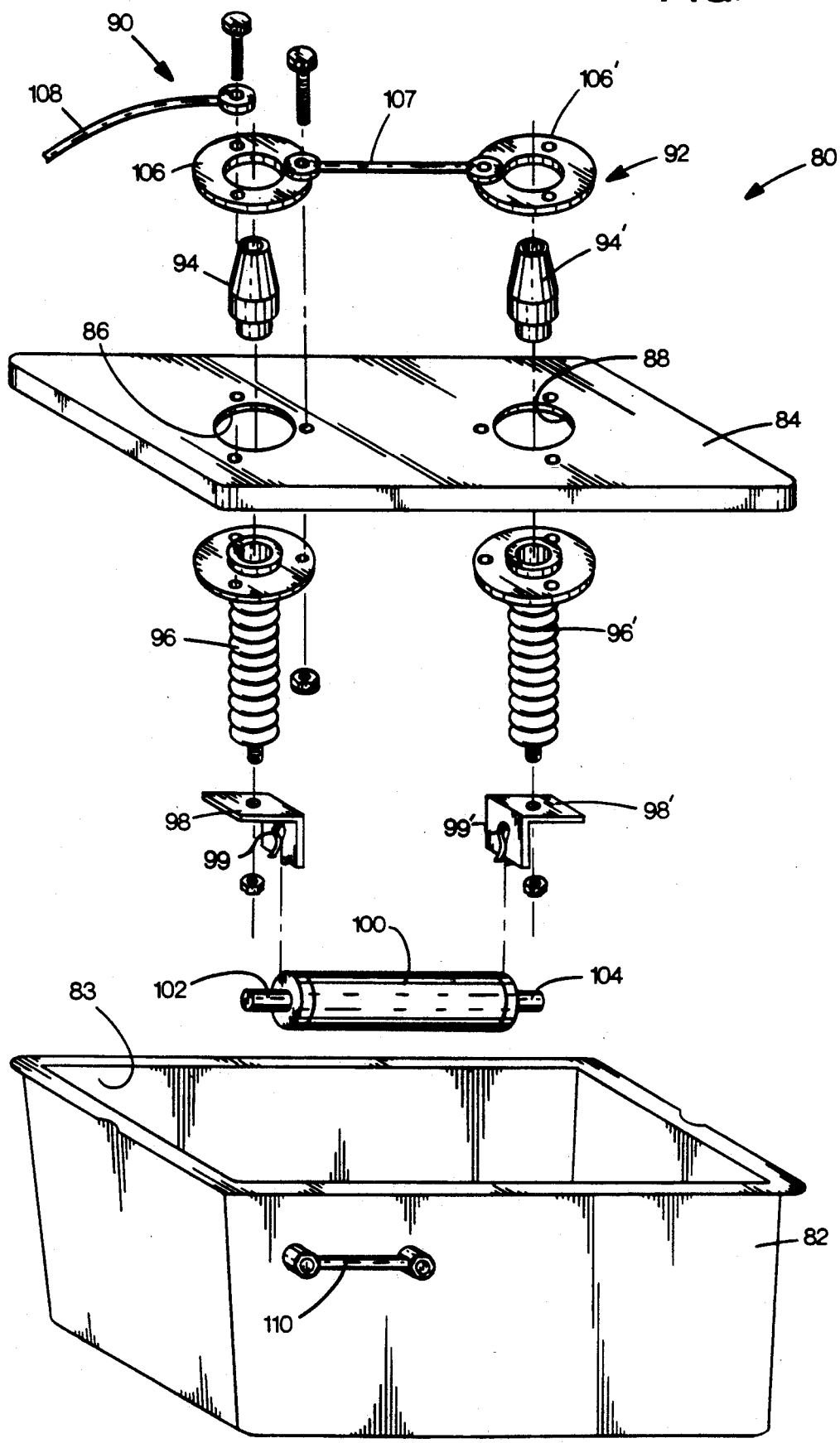
FIG. 4 is an exploded perspective view of one form of a current limiting apparatus of the present invention for locating a fault in an underground power distribution system.

FIG. 4 illustrates an embodiment of an underground current limiting apparatus 80 constructed in accordance with the present invention. The apparatus 80 has a box-like enclosure 82 defining a fuse receiving chamber 83, and a lid 84 sized to seal the enclosure 82. The enclosure 82 and lid 84 are each of an insulative material. Latching means, such as an eyelet and turnbuckle (not shown) may be used to releasably secure lid 84 to enclosure 82.

The lid 84 has two holes 86 and 88 therethrough for receiving two bushing assemblies 90 and 92, respectively. The illustrated current limiting device 80 is constructed for a 15 kV BIL (basic insulation level) voltage class. The bushing assemblies 90 and 92 each include a 15 kV, 200 ampere load break elbow type bushing 94 which is interconnected with a downwardly extending 15 kV dry type bushing 96. (The like components of bushing assemblies 90 and 92 are distinguished by the addition of the prime symbol ' to the item numbers for bushing assembly 94.) Bushings 94 and 96 are interconnected and bolted to lid 84. A fuse mounting bracket 98 having a spring loaded fuse clip 99 is bolted to the bottom of bushing 96.

For testing or trouble shooting to locate a fault in an underground power distribution system, a current limiting fuse (CLF) 100 is snapped into the spring loaded fuse clips 99 and 99' of bushing assemblies 90 and 92. Such current limiting fuses are known in the power distribution industry, and generally comprise a fiberglass-wound resin fuse tube is filled with sand. A filament or ribbon-type fuse element (not shown) is surrounded by the sand in the fuse tube and interconnects fuse terminals 102 and 104. When the fuse blows, the energy produced by the melting of the fuse element (caused by the fault current flowing therethrough) is absorbed by the filler sand, resulting in glassification of the sand surrounding the fuse element. This type of current limiting fuse typically does not expel any type of gas when blown. However, if a gas generating type fuse where used, the enclosure 82 or lid 84 may be equipped with a vent (not shown).

Each bushing assembly 90 and 92 has a bushing assembly collar 106. For grounding purposes during testing, an insulated conductor 107 couples the collars 106 and 106' together. A second insulated grounding conductor 108 interconnects one of the bushing assembly collars, such as 106, with an enclosure grounding contact, such as grounding bar 110.

Figure 3B:
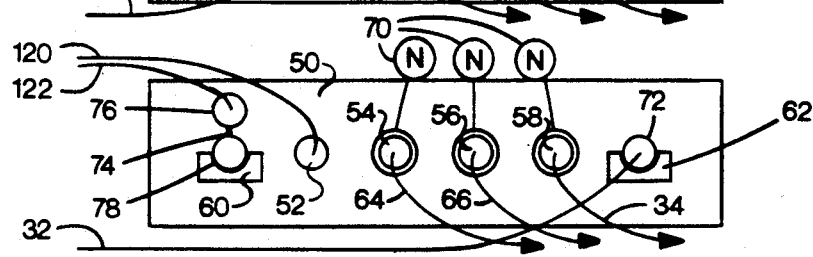
Figure 3C:
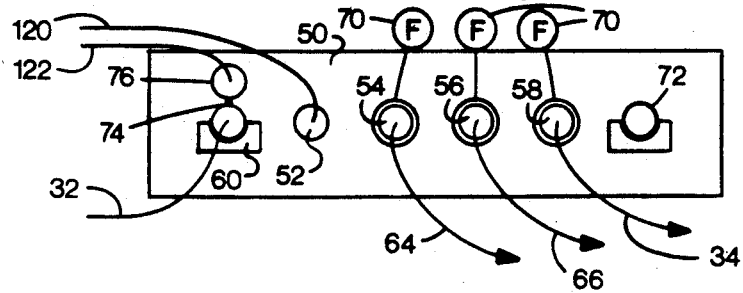

With reference to FIGS. 1 through 3, a method in accordance with the present invention of locating permanent faults in an underground power distribution system will now be illustrated with respect to the system 10 having line to ground fault 68A' interconnecting line 68A with ground. Upon initial occurrence of a fault, the recloser 20 operates by instantaneously opening and reconnecting feeder line 22 a preset number of times. Typically, the switchgear fuses and recloser 20 are coordinated so the switchgear fuse blows to open the faulted line just prior to the last reclosing of the recloser 20. This isolates the faulted group of lines, beginning with line 32 and extending through vault $V_4$, from the balance of the system 10, so power delivery may be maintained to other upstream customers receiving power from switchgear 24, such as those customers receiving power from vault $V_5$.

Upon detection of the described outage, since power delivery continues to customers fed from vault $V_5$, while customers fed from vaults $V_1$ through $V_4$ are experiencing an outage, it is apparent that feeder 22 is in tact. Given this, the electric power utility line crew then determines which fuses are blown in fuse bank 30 of switchgear 24. Typically, this is done by physically opening the switchgear and inspecting the fuse bank. When line 68A in phase A is faulted, fuse 30A is blown.

In trouble shooting to locate the fault 68A', the first line 32 between the switchgear 24 and vault $V_1$ is checked for continuity. This may be done by opening vault $V_1$ and moving the incoming line 32 from lateral terminal 52 (see FIG. 3A) to an insulated terminal 72, placed in parking terminal 62 of lateral 50. (Since the illustrated procedure is applicable to either of phases A, B or C having the fault, the lines and terminals are now referred to by their number designations only, without the letter designations A, B or C to refer to phases.) If line 32 is found intact, a fault indicator 70 are installed on each line of the faulted phase, here phase A, issuing from vaults $V_1$, $V_2$, $V_3$ and $V_4$. Thus fault indicators are installed on lines 64A, 66A, 34A, 112A, 36A, 114A, 68A, 38A, 116A and 118A (see FIGS. 1 and 3B). Fault indicators 70 may also be installed on all distribution transformers fed by the outgoing lines 64A, 66A, 112A, 114A, 68A, 116A and 118A.

Referring now to FIG. 3B, one method of using the underground current limiting tool 80 to locate fault 68A' in the underground distribution system 10 is illustrated. As shown in FIGS. 2 and 3B, the incoming line 32 is placed on the insulated terminal 72 in the first vault $V_1$, and the apparatus 80 is installed at the faulted lateral 50, here 50A as determined from the blown fuse 30A. The fuse 100 is inserted in series with and between switchgear 24 and first vault $V_1$ in the following manner. A first insulated conductor 120 couples bushing terminal 94 of bushing assembly 90 with terminal 52 of lateral 50. A second insulated conductor 122 couples bushing 94' of bushing assembly 92 with terminal 76 of a two-way connector 74 inserted in parking terminal 60. A grounding conductor 124 extends from the grounding bar 110 of apparatus 80 to a common ground 126 within vault $V_1$. In the illustrated example, conductors 120, 122 and 124 are sized of a length which allows the apparatus 80 to rest on the ground surface 130 outside vault $V_1$. With the apparatus 80 installed as shown in FIG. 3B, fuse 30A is then replaced in switchgear 24. Alternatively, fuse 30A may be replaced prior to the interconnection of apparatus 80, and after verifying the integrity of line 32. From ground level outside the vault using a hot stick, a line crew worker moves line 32 from the insulated terminal 72 to terminal 78 of the two-way connector 74. Alternatively, line 32 may be connected to terminal 78, and the line energized by reconnecting a new fuse 30A at switchgear 24. Upon this interconnection, the fault current is delivered through fuse 30A, lines 32, 64A, 66A, 34A, 112A, 36A, 114A, 68A and through fault 68A' to ground.

The fault is located by inspecting each fault indicator 70 which had previously been installed, including fault indicators which may have been installed on all distribution transformers fed by the outgoing lines 64A, 66A, 112A, 114A, 68A, 116A and 118A. The fault indicators 70 through which the fault current has flowed indicate this with the letter F. The fault indicators on lines 38A, 116A and 118A, which did not receive the fault current still indicate N, for neutral.

Having located the source of the fault as being within vault $V_3$ or one of the lines issuing therefrom, vault $V_3$ may be sectionalized and isolated from the balance of the distribution system 10. Vault $V_3$ may be isolated line by switching means (not shown) if provided in lines 36 and 38. Alternatively, the incoming line 36 and outgoing lines 38 may be disconnected from the lateral 50 and placed on insulated terminals such as 72. To restore power to the customers supplied by vault $V_4$, switch 46 is closed to energize line 48 and supply power to vault $V_4$.

Using the method of the present invention as illustrated above, fault 68A' is located without interrupting service to the upstream customers supplied by vault $V_5$. The current limiting fuse 100 clears the line before operation of the substation recloser 20. This is advantageous over the earlier known method where such upstream customers would experience a series of power outages and surges when the recloser 20 operates during testing of each of the individual lines connected to the faulted lateral, such as lines 64, 66 and 34. Therefore, unnecessary lighting blinks and power spikes to the equipment of customers served by vault $V_5$ are eliminated. This results in better customer creditability for the electric power utility.

Furthermore, the fault 68A' is located at the expenditure of one current limiting fuse 100, which is more cost effective than replacing several switchgear fuses blown while attempting to locate the fault using the earlier known method. Additionally, the current limiting fuse 100 is very quiet when clearing the faulted line. Using the apparatus 80 advantageously substantially eliminates the chance of arcing and fires within vault V₁ during re-energization of line 32. Therefore, the method of the present invention is safer for line crews to use when trouble shooting and locating faults in underground power distribution systems.

Having illustrated and described the principles of our invention with respect to a preferred embodiment, it should be apparent to those skilled in the art that our invention may be modified in arrangement and detail without departing from such principles. For example, other enclosures 82, 84 and bushing assemblies 90, 92 may be employed, as well as suitable electrical sizing and dimensional variations and substitutions for the components of the current limiting apparatus 80. Additionally, the method of the present invention may be modified for other types of underground power distribution systems, terminals and vault arrangements, such as those used in urban or industrial settings. We claim all such modifications falling within the scope and spirit of the following claims.

We claim:

1. A method of locating a fault in an underground power distribution system receiving power from a bulk power source and distributing the received power to power consumers through a fused switchgear unit and a first vault the first vault distributing power from the fused switchgear unit among plural outgoing underground power lines, each underground outgoing power line supplying power to at least one power consumer, the method comprising the steps of:

identifying the fused switchgear unit and the first vault which normally supply power to a line having the fault;

installing a fault indicator on outgoing underground power lines in the first vault;

inserting a current limiting fuse in series with and between the fused switchgear unit and the first vault;

reenergizing the first vault outgoing underground power lines through the current limiting fuse and causing the current limiting fuse to blow; and reading each fault indicator after the reenergizing step to determine the location of the fault.

2. A method according to claim 1 for an underground power distribution system having a substation receiving power from a bulk power source and distributing the received power through a substation recloser to the fused switchgear unit, with the underground power distribution system having upstream power consumers receiving power from the substation before the first vault, comprising the step of blowing the current limiting fuse during the reenergizing step before the substation recloser can operate so as to prevent the upstream power consumers from experiencing an interruption in power delivery due to operation of the substation recloser.

3. A method according to claim 1 further including, between the identifying and installing steps, the step of checking the continuity of a power line interconnecting the fused switchgear unit and the first vault.

4. A method according to claim 1 for a three phase power system having fused switchgear with a switch and a fuse in each of the three phases, the fuse of each phase between the switch and the first vault, wherein:

the method further includes the step of checking each fuse of the fused switchgear unit to determine in which phase the fault has occurred; and the step of installing the fault indicators comprises the step of installing fault indicators only on the underground outgoing power lines of the faulted phase.

5. A method according to claim 1 for an underground power distribution system having at least one subsequent vault receiving power from the first vault, wherein the step of installing the fault indicators comprises the step of installing a fault indicator on each of the underground outgoing power lines of each subsequent vault.

6. A method according to claim 1 for an underground power distribution system wherein at least one underground outgoing power line delivers power to at least one distribution transformer, and wherein the step of installing the fault indicators further comprises the step of installing a fault indicator on each distribution transformer.

7. A method of locating a fault in a polyphase power distribution system power distributing power from a bulk power source to power consumers, the power distribution system having a substation feeding a fused switchgear unit, a first vault, and at least one subsequent vault receiving power from the first vault, the first vault distributing power from the fused switchgear unit among plural outgoing underground power lines, each underground outgoing power line supplying power to at least one power consumer, the method comprising the steps of:

checking fusing within the fused switchgear unit to determine in which phase the fault has occurred;

checking the continuity of a power line interconnecting the fused switchgear unit and the first vault;

identifying the fused switchgear unit and the first vault which normally supply power to a line having the fault;

installing a fault indicator on each underground outgoing power line of the faulted phase in the first vault and in each subsequent vault;

inserting a current limiting fuse in series with and between the fused switchgear unit and the first vault;

reenergizing the first vault plural outgoing underground power lines through the current limiting fuse and causing the current limiting fuse to blow; and reading each fault indicator after the reenergizing step to determine the location of the fault.

8. A method according to claim 7 for an underground power distribution system wherein at least one underground outgoing power line delivers power to at least one distribution transformer, wherein the step of installing the fault indicators further comprises installing a fault indicator on each distribution transformer.

9. A method according to claim 7 for an underground power distribution system having the substation distributing power through a substation recloser to the fused switchgear unit, with the underground power distribution system having upstream power consumers receiving power from the substation before the first vault, wherein during the reenergizing step, the current limiting fuse blows before the substation recloser can operate so as to prevent the upstream power consumers from experiencing an interruption in power delivery due to operation of the substation recloser.

* * * * *